United States Patent
Hsieh et al.

(10) Patent No.: US 9,105,826 B2
(45) Date of Patent: Aug. 11, 2015

(54) FRAME STRUCTURE FOR LIGHT EMITTING DIODES

(71) Applicant: LUMENMAX OPTOELECTRONICS CO., LTD., Taoyuan County (TW)

(72) Inventors: Chia-Han Hsieh, Taoyuan County (TW); Jerrold Huang, Taoyuan County (TW)

(73) Assignee: Lumenmax Optoelectronics Co., Ltd., Taoyuan County (TW)

( * ) Notice: Subject to any disclaimer, the term of this patent is extended or adjusted under 35 U.S.C. 154(b) by 63 days.

(21) Appl. No.: 14/136,006

(22) Filed: Dec. 20, 2013

(65) Prior Publication Data
US 2014/0204597 A1    Jul. 24, 2014

(30) Foreign Application Priority Data

Jan. 24, 2013   (TW) ............................. 102201591 U

(51) Int. Cl.
*F21V 29/00*   (2006.01)
*H01L 33/62*   (2010.01)
*H01L 33/48*   (2010.01)

(52) U.S. Cl.
CPC .............. *H01L 33/62* (2013.01); *H01L 33/486* (2013.01); *H01L 2924/0002* (2013.01)

(58) Field of Classification Search
CPC ........ F21V 29/02; H01L 33/684; H01L 33/64
USPC .......................... 362/294; 257/98, 99
See application file for complete search history.

(56) References Cited

U.S. PATENT DOCUMENTS

| | | | | |
|---|---|---|---|---|
| 6,472,765 | B1* | 10/2002 | Sano et al. .................... 257/787 |
| 8,152,336 | B2* | 4/2012 | Alexander et al. ........ 362/249.11 |
| 8,414,178 | B2* | 4/2013 | Alexander et al. ............ 362/655 |
| 8,419,209 | B2* | 4/2013 | Mai .......................... 362/217.14 |
| 2006/0054912 | A1* | 3/2006 | Murakami et al. .............. 257/99 |
| 2007/0080337 | A1* | 4/2007 | Sorg ................................ 257/13 |
| 2008/0048201 | A1* | 2/2008 | Kim et al. ....................... 257/98 |
| 2008/0121921 | A1* | 5/2008 | Loh et al. ........................ 257/99 |

* cited by examiner

*Primary Examiner* — Ali Alavi
(74) *Attorney, Agent, or Firm* — Rosenberg, Klein & Lee

(57) ABSTRACT

The invention relates to a frame structure for light emitting diodes comprises plastic stand having a containing room with a conical opening and at least two metal frames being not connected, relatively arranged in the containing room of the plastic stand and one of the metal frames having a concave chip bearing stand for bearing light emitting diodes wherein the conical opening of the plastic stand is greater than the concave chip bearing stand and the concave chip bearing stand has a bottom edge revealed at a bottom of the plastic stand; the area of the concave chip bearing stand is greater than 40% of the area of the conical opening of the plastic stand to increase the cooling area of the metal frames for the light-emitting diodes with the different wattage sharing the same specification frame structure to reduce the cost of metal frames molding.

6 Claims, 6 Drawing Sheets

FRAME STRUCTURE FOR LIGHT EMITTING DIODES

BACKGROUND OF THE INVENTION

1. Field of the Invention

The invention relates to a frame structure for light emitting diodes, particularly to the frame structure having a large cooling area to enhance overall cooling efficiency.

2. Description of the Related Art

LED, light emitting diode, is a semiconductor solid light-emitting device which uses a solid semiconductor chip as a light emitting material. Due to the advantages of high energy-saving, long life and environmental protection, LED applications are more and more widely. LED has environmental protection and energy saving features considered as a replacement of traditional light bulbs as the light source lighting. The volume of LED is quite small, so LED frames are required in most of the production process for providing leads to connect the LED chip.

The US Patent Pub. No. 2010/0001306 as shown in FIG. 1 discloses a light emitting diode package 100, comprising a mold 102 with an opening portion 101, a plurality of lead frames 103, 104, 105 extending from an inside of the opening portion 101 to an outside of the mold 102 and a cavity 106 having a bottom exposed at a bottom of the mold 102 to increase cooling effect. An angle θ1 of an inner wall of the opening portion 101 is smaller than an angle θ2 of an inner wall of the cavity 106. Hence, the reflected light passing through the opening portion 101 is increased and thus the luminous height cannot be increased.

A conventional frame structure 110 for the light emitting diodes as shown in FIG. 2A has features similar with the frame 100 as shown in FIG. 1, comprising a mold 112 with an opening portion 111, a plurality of lead frames 113, 114, 115 and a cavity 116. However, the cavity 116 has a deeper depth d1 and thus a part of light is covered, having poor light-emitting efficiency; the cavity 116 is thin and thus it is easy to be broken, reducing reliability.

The Taiwan Utility Model No. M376909 applied by Fu Sheng Industrial Company discloses a frame structure 120 for the light emitting diode to improve the conventional problems. The cavity 126 has a highest horizontal position lower than horizontal position of lead frames 123, 124 extending from a mold 122; that is, h>H. The cavity 126 is arranged in the mold 122 to decrease the depth d2 of the cavity 126 to maintain the thickness and structural strength.

The Taiwan Utility Model No. M408793 applied by Honhai Precision Industry Company discloses a light emitting diode lead frame 130, including a base 132 defined a top recess 131 and a lower recess 137, a plurality of metal frame 133, 134, 135 partially embedded in the base 132 and a chip bearing stand 136 for bearing the chips. The top recess 131 and the lower recess 137 include an inclined inner wall. A lighting area of a top of the top recess 131 is from 5.5 to 6.5 times of a bottom of the lower recess 137. An angle B1 defined between two opposed walls of the top recess 131 is larger than another angle B2 defined between corresponding two opposed walls of the lower recess 137. Thus, the reflected light from the wall of the top recess 131 is decreased to enhance the light-emitting efficiency.

Based on the conventional features disclosed, according to the amount of wattage of the LED chip, the LED frame is molded and stamped in response to the cooling requirements of the LEDs. That is, a smaller wattage LED chip has a smaller size of specification of LED frame referring to a small cooling area. Conversely, a larger wattage LED chip has a larger size of specification of LED frame referring to a larger cooling area. If a large wattage LED chip has a small size of specification of LED frame, the LED chip will be overheating, resulting poor light-emitting efficiency of light difference. Therefore, there is room for improvement.

SUMMARY OF THE INVENTION

It is a primary object of the present invention to provide a frame structure for light emitting diodes having a concave chip bearing stand of a plastic stand to increase the area of metal frames at a bottom of the plastic stand so that the cooling area is increased to improve the overall thermal efficiency, providing different wattage light-emitting diodes can share the same specifications size of the metal stent to reduce the cost of the mold open metal stents required.

It is another object of the present invention to provide a chip bearing stand with predetermined type and area for maintaining the bonding strength of the plastic stand and the chip bearing stand and to provide the light-emitting diodes with the different wattage sharing the same specification frame structure.

In order to achieve the above objects, the frame structure for light emitting diodes comprises a plastic stand having a containing room with a conical opening and at least two metal frames being not connected, relatively arranged in the containing room of the plastic stand and coated by the plastic stand and a part thereof extended out of the plastic stand, one of the metal frames having a concave chip bearing stand for bearing light emitting diodes; wherein the concave chip bearing stand is a long-shaped body and the length thereof L2 is at least two times greater than the width thereof W2; and the conical opening of the plastic stand is greater than the concave chip bearing stand and the concave chip bearing stand has a bottom edge revealed at a bottom of the plastic stand; the area A2 of the concave chip bearing stand is greater than 40% of the area A1 of the conical opening of the plastic stand to increase the cooling area of the metal frames for the different wattage of the light-emitting diodes share the same specification frame structure.

Based on the features disclosed, the present invention provides the plastic stand 30 with the same specifications and the structure of the first metal frame and second metal frame coated by the U-shaped clamp for the conical opening of the plastic stand being retracted without affecting the overall bonding strength to increase the area of the concave chip bearing stand and solve the LED luminous efficiency attenuation problem. Therefore, the frame structure of the present invention is provided for the LED with different wattage to reduce the cost.

DETAILED DESCRIPTION OF THE PREFERRED EMBODIMENT

Figure 1:
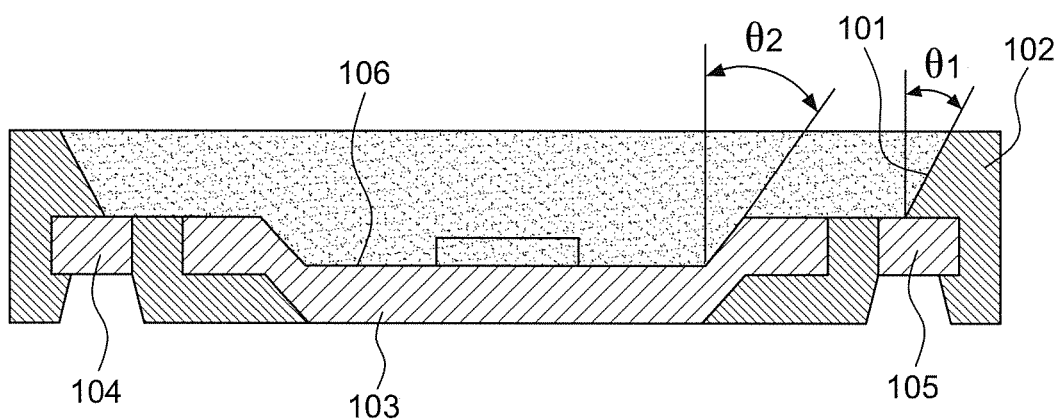
FIG. 1 is a sectional view of a light emitting diode package according to the US Patent Pub. No. 2010/0001306.
Figure 2A:
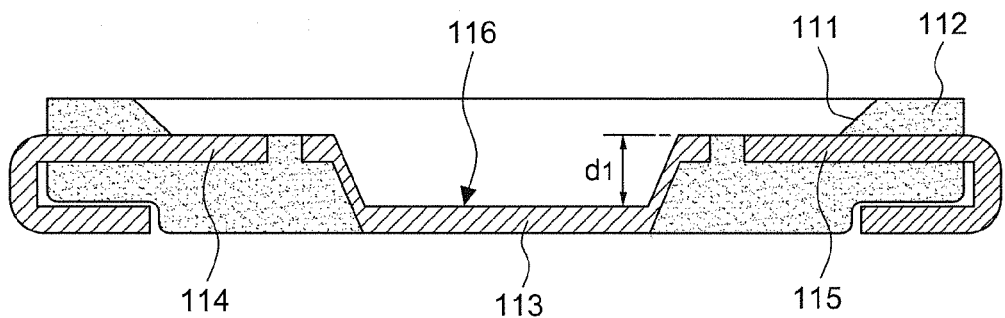
FIG. 2A is a sectional view of a conventional frame structure for light emitting diodes.
Figure 2B:
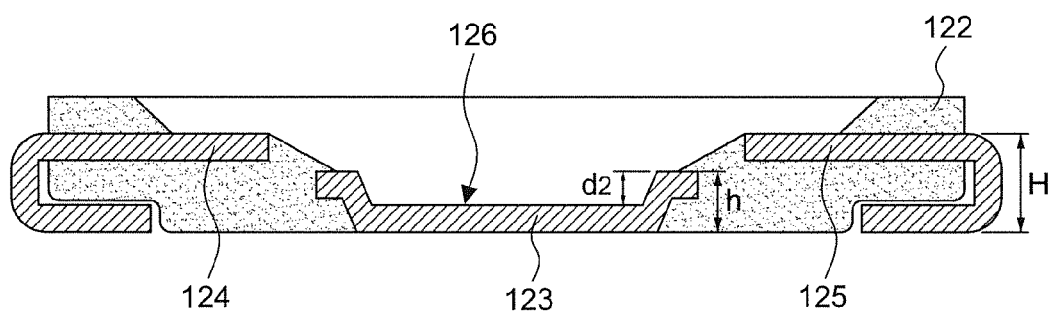
FIG. 2B is a sectional view of the TW Utility Model No. M376909.
Figure 3A:
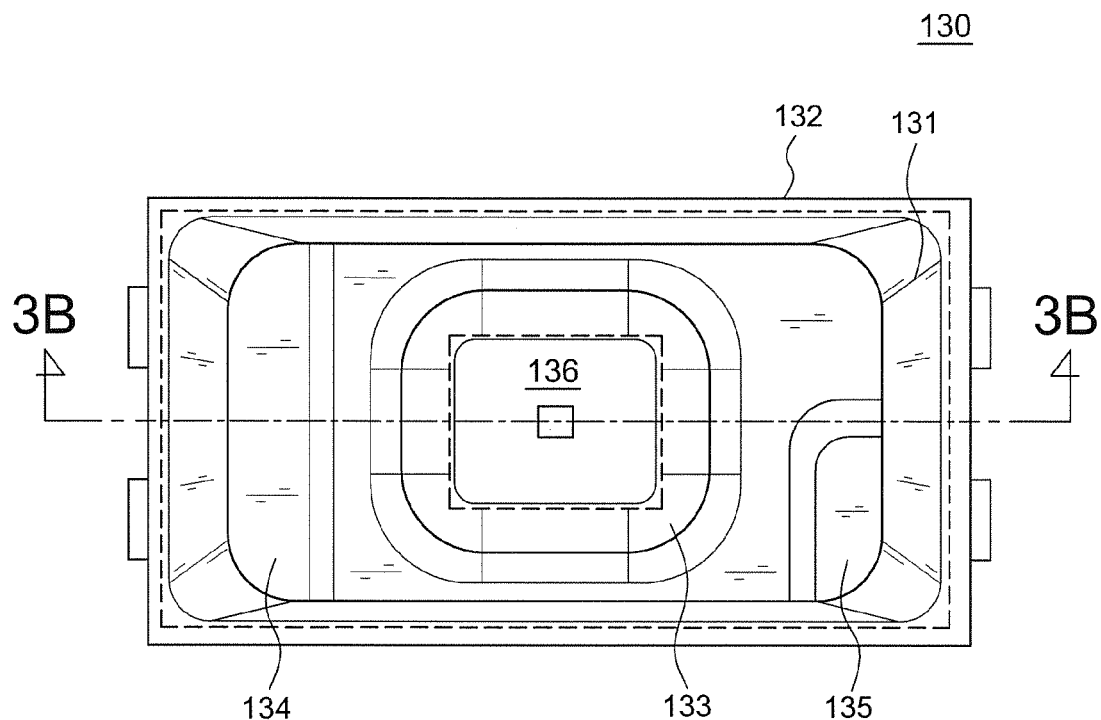
FIG. 3A is a top plan view of the TW Utility Model No. M40879.
Figure 3B:
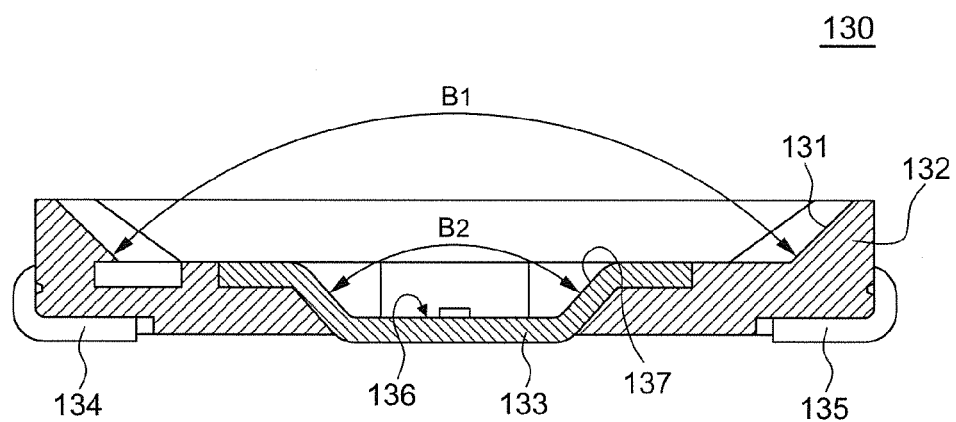
FIG. 3B is a sectional view of the TW Utility Model No. M40879.
Figure 4:
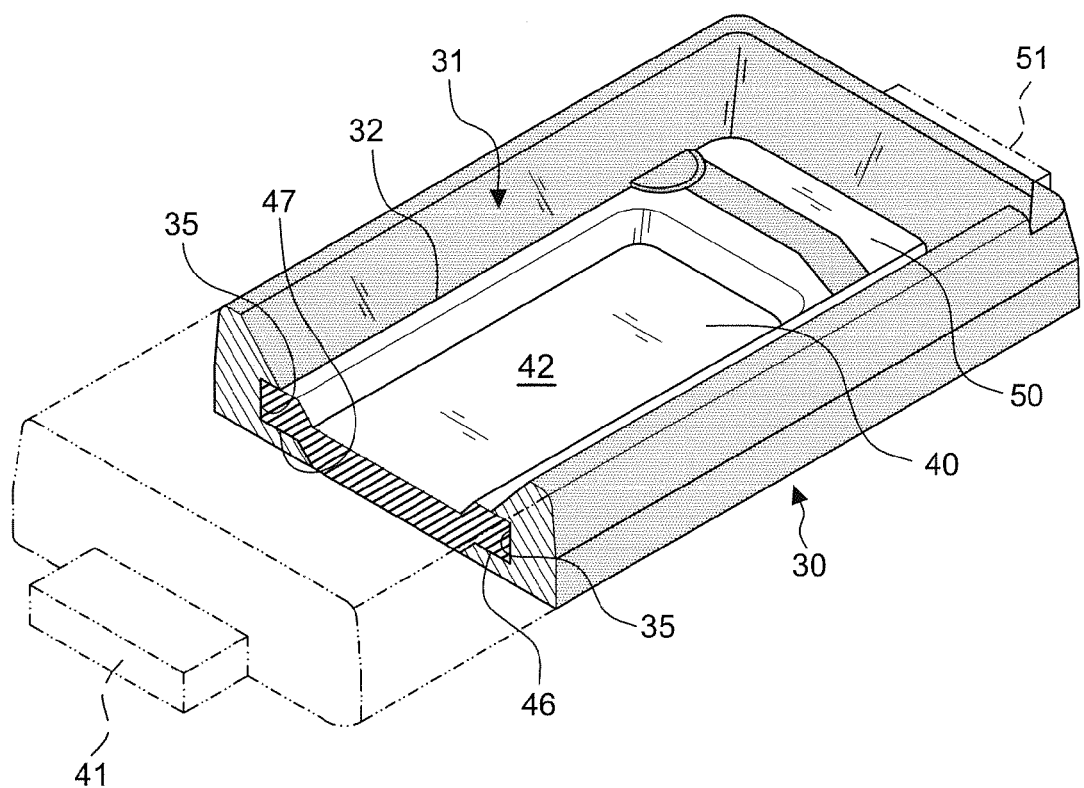
FIG. 4 is a schematic view of a metal frames structure in accordance with the present invention.
Figure 5:
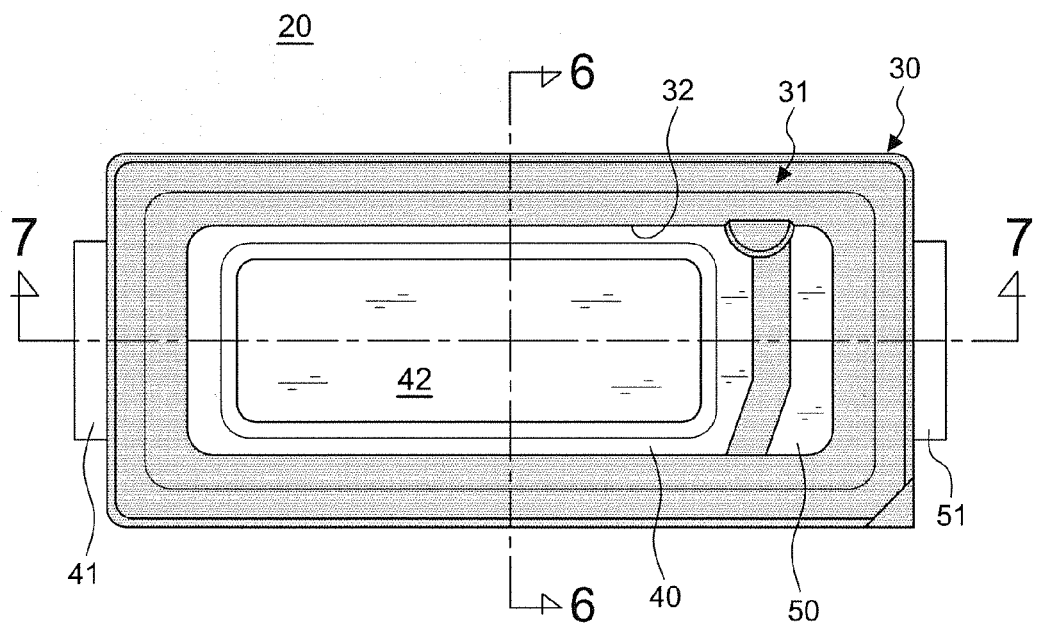
FIG. 5 is a top plan view of the present invention.

Referring to FIGS. 4 through 7, the preferred embodiment of a frame structure 20 for light emitting diodes in accordance with the present invention comprises: a plastic stand 30 having a containing room 31 with a conical opening 32 and at least two metal frames.

In the embodiment, the metal frames include a first metal frame 40 and a second metal frame 50 but it is not a limitation. The first metal frame 40 and second metal frame 50 are not connected and relatively arranged in the containing room 31 of the plastic stand 30. The first metal frame 40 and second metal frame 50 are coated by the plastic stand 30 and a part thereof is extended out of the plastic stand 30. Moreover, the first metal frame 40 includes a concave chip bearing stand 42 for bearing light emitting diodes. The features disclosed are belong to prior art and thus will not be described in details here.

The present invention is characterized in that the concave chip bearing stand 42 is a long-shaped body and the length thereof L2 is at least two times greater than the width thereof W2; the conical opening 32 of the plastic stand 30 is greater than the concave chip bearing stand 42 and the concave chip bearing stand 42 has a bottom edge revealed at a bottom of the plastic stand 30. Moreover, the area A2 of the concave chip bearing stand 42 is greater than 40% of the area A1 of the conical opening 32 of the plastic stand 30 to increase the cooling area of the concave chip bearing stand 42 for the light-emitting diodes with the different wattage sharing the same specification frame structure.

In the preferred embodiment, the first metal frame 40 and the second metal frame 50 respectively has a first metal lead 41 and a second metal lead 51 extending out of the plastic stand 30 and the first metal lead 41 and second metal lead 51 have bottom edges revealed at the bottom of the plastic stand 30 and flushed with the bottom edge of the concave chip bearing stand 42.

Figure 7:
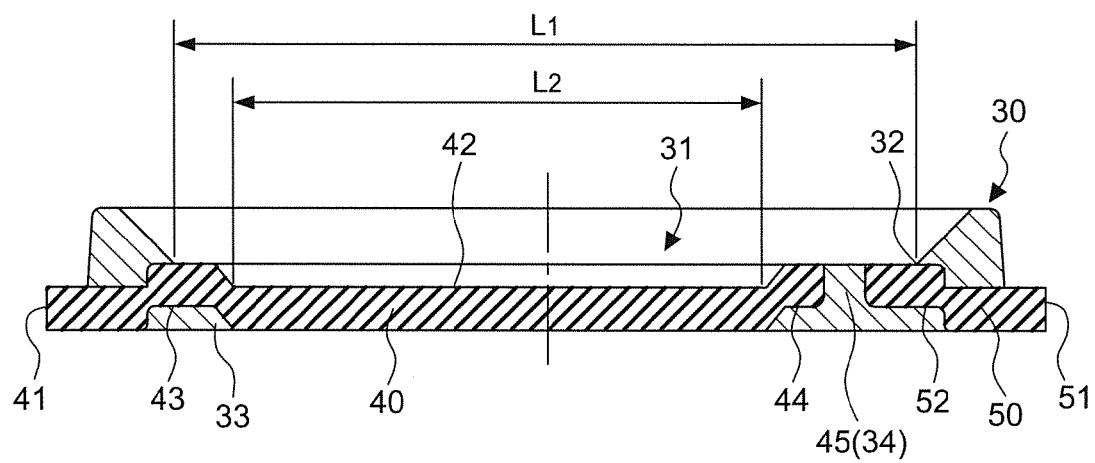
FIG. 7 is cross-sectional view taken along the line 7-7 in FIG. 5.

With the reference to FIG. 7, the first metal frame 40 has a first concave 43 among a bottom edge thereof, a bottom surface of the concave chip bearing stand 42 and the first metal lead 41 and the first concave 43 is coated by a first plastic bottom 33 which is a part of the plastic stand 30. The first plastic bottom 33 does not expose beyond a bottom surface of the first concave 43.

Further, the first metal frame 40 and the second metal frame 50 have bottoms of opposite sides respectively forming a second concave 44 and a third concave 52 to form a T-shaped gap 45 between the first metal frame 40 and the second metal frame 50 and the T-shaped gap 45 is coated by a second plastic bottom 34 which is a part of the plastic stand 30. The second plastic bottom 34 does not expose beyond a bottom surface of the T-shaped gap 45.

Figure 6:
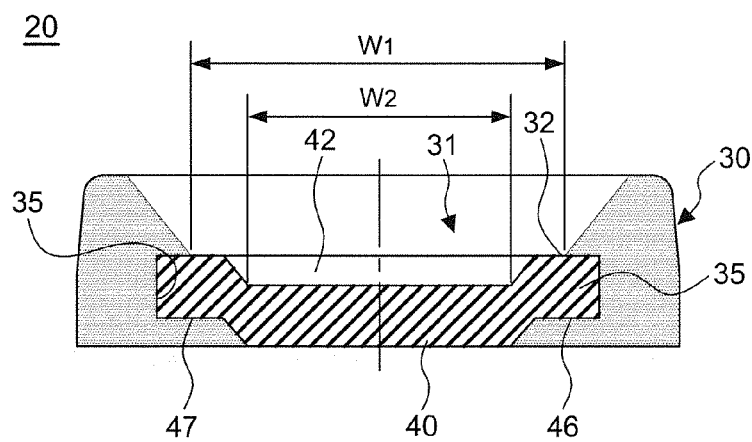
FIG. 6 is a cross-sectional view taken along the line 6-6 in FIG. 5.

With the reference with FIG. 6, the first metal frame 40 and the second metal frame 50 have bottoms of a front side and rear side without the metal leads respectively forming a fourth concave 46 and a fifth concave 47 which are coated by an inward U-shaped clamp 35 formed by the plastic stand 30.

Based on the features disclosed, the present invention provides the plastic stand 30 with the same specifications and the structure of the first metal frame 40 and second metal frame 50 coated by the U-shaped clamp 35 for the conical opening 32 of the plastic stand 30 being retracted without affecting the overall bonding strength to increase the area of the concave chip bearing stand 42.

Figure 8:
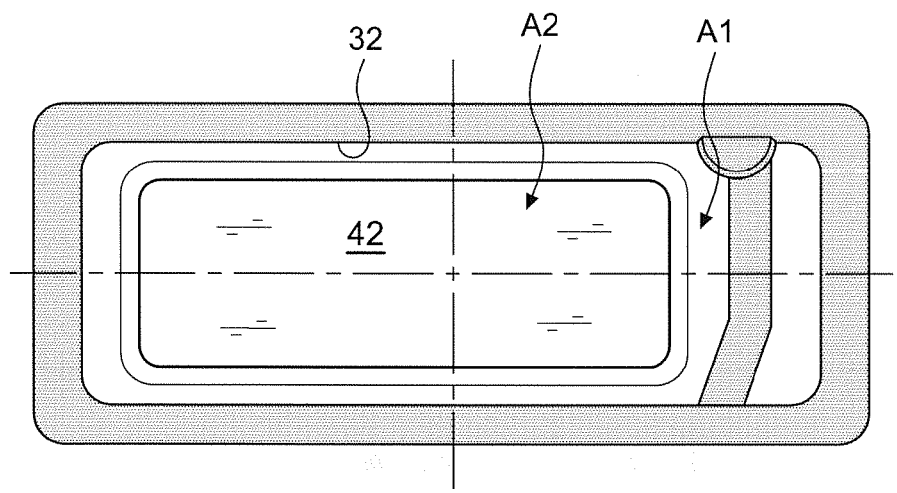
FIG. 8 is schematic view of an area ratio of a conical opening and a concave chip bearing stand in accordance with the present invention.

In an applicable embodiment, the height H of the plastic stand 30 is between 0.8 mm and 1.2 mm; the length of the plastic stand 30 is 3.3 mm; the width W1 is 1.5 mm. At the same time, the length L1 of the conical opening 32 is about 2.9 mm and the width is 1.1 mm; such that the area A1 of the conical opening 32 is 3.19 mm$^2$; the length L2 of the concave chip bearing stand 42 is 2.4 mm and the width W2 is 0.6 mm, forming the long-shaped body with the length L2 being at least two times greater than the width W2 and the area A2 of the concave chip bearing stand 42 being 1.44 mm$^2$ which is 45% of the area A1 of the conical opening 32. With the referenced to FIG. 8, the overall area A2 of the concave chip bearing stand 42 is greater than 40% of the area A1 of the conical opening 32.

The cooling area of the metal frames is increased due to the long-shaped body of the concave chip bearing stand 42; the metal leads extended out of the plastic stand 30; a large bare area of the bottom surface of the concave chip bearing stand 42. Therefore, the present invention provides the frame structure for LED with different wattage to reduce the cost.

What is claimed is:

1. A frame structure for light emitting diodes, comprising:
a plastic stand having a containing room with a conical opening and at least two metal frames being not connected, relatively arranged in the containing room of the plastic stand and coated by the plastic stand and a part thereof extended out of the plastic stand, one of the metal frames having a concave chip bearing stand for bearing light emitting diodes, wherein
the concave chip bearing stand is a long-shaped body and the length thereof L2 is at least two times greater than the width thereof W2; and
the conical opening of the plastic stand is greater than the concave chip bearing stand and the concave chip bearing stand has a bottom edge revealed at a bottom of the plastic stand; the area A2 of the concave chip bearing stand is greater than 40% of the area A1 of the conical opening of the plastic stand to increase the cooling area of the metal frames for the light-emitting diodes with the different wattage sharing the same specification frame structure.

2. The frame structure for light emitting diodes as claimed in claim 1, wherein the metal frames include a first metal frame and a second metal frame; each of the metal frames has a first metal lead and a second metal lead extending out of the plastic stand and the first metal lead and second metal lead have bottom edges revealed at the bottom of the plastic stand and flushed with the bottom edge of the concave chip bearing stand.

3. The frame structure for light emitting diodes as claimed in claim 2, wherein the first metal frame has a first concave among a bottom edge thereof, a bottom surface of the concave chip bearing stand and the first metal lead and the first concave is coated by a first plastic bottom which does not expose beyond a bottom surface of the first concave.

4. The frame structure for light emitting diodes as claimed in claim 3, wherein the first metal frame and the second metal frame have bottoms of opposite sides respectively forming a second concave and a third concave to form a T-shaped gap between the first metal frame and the second metal frame and the T-shaped gap is coated by a second plastic bottom which does not expose beyond a bottom surface of the T-shaped gap.

5. The frame structure for light emitting diodes as claimed in claim 4, wherein the first metal frame and the second metal frame have bottoms of a front side and rear side without the metal leads respectively forming a fourth concave and a fifth concave which are coated by an inward U-shaped clamp formed by the plastic stand.

6. The frame structure for light emitting diodes as claimed in claim 1, wherein the plastic stand has a height between 0.8 mm to 1.5 mm.

* * * * *